United States Patent
Wu et al.

(10) Patent No.: US 12,252,613 B1
(45) Date of Patent: Mar. 18, 2025

(54) PACKAGING FILM AND PREPARATION METHOD THEREOF, AND FILTER CHIP PACKAGING METHOD

(71) Applicant: WUHAN CHOICE TECHNOLOGY CO., LTD., Wuhan (CN)

(72) Inventors: De Wu, Wuhan (CN); Ting Li, Wuhan (CN); Shuhang Liao, Wuhan (CN); Junxing Su, Wuhan (CN)

(73) Assignee: WUHAN CHOICE TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 18/931,127

(22) Filed: Oct. 30, 2024

Related U.S. Application Data

(63) Continuation of application No. PCT/CN2024/088248, filed on Apr. 17, 2024.

(30) Foreign Application Priority Data

Oct. 11, 2023 (CN) .......................... 202311312691.4

(51) Int. Cl.
| | |
|---|---|
| C09J 163/00 | (2006.01) |
| C08J 5/18 | (2006.01) |
| C08K 3/36 | (2006.01) |
| C08K 5/315 | (2006.01) |
| C08K 5/357 | (2006.01) |
| C08K 7/18 | (2006.01) |
| C08L 71/10 | (2006.01) |
| H01L 21/56 | (2006.01) |
| H01L 23/29 | (2006.01) |

(52) U.S. Cl.
CPC ............... *C08L 71/10* (2013.01); *C08J 5/18* (2013.01); *C08K 3/36* (2013.01); *C08K 5/3155* (2013.01); *C08K 5/357* (2013.01); *C08K 7/18* (2013.01); *H01L 21/56* (2013.01); *H01L 23/293* (2013.01); *C08J 2371/10* (2013.01)

(58) Field of Classification Search
CPC ............ C09J 163/00; C09J 11/06; C09J 11/08
See application file for complete search history.

(56) References Cited

U.S. PATENT DOCUMENTS

| | | |
|---|---|---|
| 2013/0161080 A1 | 6/2013 | Lin |
| 2020/0062949 A1 | 2/2020 | Taniguchi et al. |
| 2023/0265322 A1* | 8/2023 | Wu ................... C09J 163/00 |
| | | 156/330 |

FOREIGN PATENT DOCUMENTS

| | | |
|---|---|---|
| CN | 106753123 A | 5/2017 |
| CN | 110387154 A | 10/2019 |
| CN | 111770954 A | 10/2020 |
| CN | 117050715 A | 11/2023 |
| JP | 2011228637 A | 11/2011 |
| JP | 2018170340 | * 11/2018 |
| JP | 2018170340 A | 11/2018 |

OTHER PUBLICATIONS

Hongyuan Wang, et al., The Effect of Curing Cycles on Curing Reactions and Properties of a Ternary System Based on Benzoxazine, Epoxy Resin, and Imidazole, Journal of Applied Polymer Science, 2012, pp. 1-7.
Yu Zhen, et al., Research Progress of Latent Curing Agent for Epoxy Resin, Polymer Bulletin, 2022, pp. 15-35, Issue. 11.

* cited by examiner

*Primary Examiner* — Gregory Listvoyb
(74) *Attorney, Agent, or Firm* — Bayramoglu Law Offices LLC

(57) ABSTRACT

A packaging film and a preparation method thereof, and a filter chip packaging method are provided. The raw materials of the packaging film include: 20-24 parts by mass of silicon dioxide, 24-26 parts by mass of aliphatic polyurethane acrylate, 12-15 parts by mass of phenoxy resin, 5-13 parts by mass of flexible liquid epoxy resin, 10 parts by mass of bisphenol F epoxy resin, 17-19 parts by mass of curing agent, 2-5 parts by mass of photoinitiator, and 0.4-0.8 parts by mass of accelerant, where the curing agent is compounded by bisphenol F-based benzoxazine curing agent and dicyandiamide curing agent according to the mass ratio of 10:(7-9). The packaging film has excellent flexibility and adhesion, a low moisture absorption rate, and high heat resistance and is especially suitable for the packaging of filter chips.

12 Claims, No Drawings

PACKAGING FILM AND PREPARATION METHOD THEREOF, AND FILTER CHIP PACKAGING METHOD

CROSS REFERENCE TO THE RELATED APPLICATIONS

This application is a continuation application of International Application No. PCT/CN2024/088248, filed on Apr. 17, 2024, which is based upon and claims priority to Chinese Patent Application No. 202311312691.4, filed on Oct. 11, 2023, the entire contents of which are incorporated herein by reference.

TECHNICAL FIELD

The application relates to the technical field of semiconductor wafer packaging, in particular to a packaging film and a preparation method thereof, and a filter chip packaging method.

BACKGROUND

A filter chip is packaged by a filter packaging film, during which the packaging film covers the front of the filter chip and surrounds the cavity functional region of the filter chip. The packaging film covering the front of the filter chip plays a protective film role, and the cavity function region surrounded forms a sealed cavity, which can prevent water vapor and other pollution and also avoid the inflow of liquid plastic sealant in the molding. The film used for filter packaging should have excellent flexibility and adhesion as well as low moisture absorption.

SUMMARY

The purpose of this application is to provide a packaging film and a preparation method thereof, and a filter chip packaging method. The packaging film has excellent flexibility and adhesion, a low moisture absorption rate, and high heat resistance and is especially suitable for the packaging of filter chips.

To achieve the above purpose, the example of this application provides, on the one hand, a filter packaging film, the raw materials of which include: 20-24 parts by mass of silicon dioxide, 24-26 parts by mass of aliphatic polyurethane acrylate, 12-15 parts by mass of phenoxy resin, 5-13 parts by mass of flexible liquid epoxy resin, 10 parts by mass of bisphenol F epoxy resin, 17-19 parts by mass of curing agent, 2-5 parts by mass of photoinitiator, and 0.4-0.8 parts by mass of accelerant, where the curing agent is compounded by bisphenol F-based benzoxazine curing agent and dicyandiamide curing agent according to the mass ratio of 10: (7-9).

As a preferred solution, the raw materials of the packaging film include:

22-24 parts by mass of silicon dioxide, 26 parts by mass of aliphatic polyurethane acrylate, 12-15 parts by mass of phenoxy resin, 5-8 parts by mass of flexible liquid epoxy resin, 10 parts by mass of bisphenol F epoxy resin, 18-19 parts by mass of curing agent, 2-5 parts by mass of photoinitiator, and 0.4-0.8 parts by mass of accelerant; where the curing agent is compounded by bisphenol F-based benzoxazine curing agent and dicyandiamide curing agent according to the mass ratio of 10: (8-9).

As a further preferred solution, the raw materials of the packaging film include: 22-24 parts by mass of silicon dioxide, 26 parts by mass of aliphatic polyurethane acrylate, 15 parts by mass of phenoxy resin, 5-8 parts by mass of flexible liquid epoxy resin, 10 parts by mass of bisphenol F epoxy resin, 19 parts by mass of curing agent, 2-5 parts by mass of photoinitiator, and 0.4-0.8 parts by mass of accelerant, where the curing agent is compounded by bisphenol F-based benzoxazine curing agent and dicyandiamide curing agent according to the mass ratio of 10:9.

As a further preferred solution, the raw materials of the packaging film include: 24 parts by mass of silicon dioxide, 26 parts by mass of aliphatic polyurethane acrylate, 15 parts by mass of phenoxy resin, 5-8 parts by mass of flexible liquid epoxy resin, 10 parts by mass of bisphenol F epoxy resin, 19 parts by mass of curing agent, 2-5 parts by mass of photoinitiator, and 0.4-0.8 parts by mass of accelerant, where the curing agent is compounded by bisphenol F-based benzoxazine curing agent and dicyandiamide curing agent according to the mass ratio of 10:9.

In some specific embodiments, spherical silicon dioxide micropowder is preferred for silicon dioxide.

In some specific embodiments, the aliphatic polyurethane acrylate is DH-3000B aliphatic polyurethane acrylate and/or DH-4000B aliphatic polyurethane acrylate.

In some specific embodiments, the flexible liquid epoxy resin is EXA-4850 product and/or YX-7105 product.

On the other hand, the example of this application provides a preparation method for the packaging film, including: taking and mixing raw materials according to parts by mass, grinding the mixed raw materials into a gelatinous mass, obtaining the glue solution through vacuum defoaming, and coating the glue solution to obtain the packaging film.

On the other hand, the example of this application provides a filter packaging method, which is: the filter chip is packaged by the packaging film. Specifically, the packaging film covers the front and surrounding sides of the filter chip.

Compared with the prior art, the invention has the following advantages and beneficial effects:

The packaging film of the application has excellent flexibility and adhesion, a low moisture absorption rate, and heat resistance, and is especially suitable for the package of filter chips. The packaging film of the application is used for the package of the filter chip, and the packaging method is simple, which can avoid water vapor, the liquid plastic sealant, and other pollution in the molding flowing into the filter chip cavity. The high glass transition temperature of the packaging film of the application makes it have excellent heat resistance and can avoid the packaging film seeping into the filter cavity at high temperature.

DETAILED DESCRIPTION OF THE EMBODIMENTS

In order to make the purpose, technical scheme, and beneficial effects of this application clearer, the application is further explained in detail in conjunction with examples below.

The example of this application provides a high flexibility packaging film, the raw materials of which include: 20-24 parts by mass of silicon dioxide, 24-26 parts by mass of aliphatic polyurethane acrylate, 12-15 parts by mass of phenoxy resin, 5-13 parts by mass of flexible liquid epoxy resin, 10 parts by mass of bisphenol F epoxy resin, 17-19 parts by mass of curing agent, 2-5 parts by mass of photoinitiator, and 0.4-0.8 parts by mass of accelerant, where the curing agent is compounded by bisphenol F-based benzoxazine curing agent and dicyandiamide curing agent according to the mass ratio of 10: (7-9).

As a preferred solution, the raw materials of the high flexibility packaging film include: 22-24 parts by mass of silicon dioxide, 26 parts by mass of aliphatic polyurethane acrylate, 12-15 parts by mass of phenoxy resin, 5-8 parts by mass of flexible liquid epoxy resin, 10 parts by mass of bisphenol F epoxy resin, 18-19 parts by mass of curing agent, 2-5 parts by mass of photoinitiator, and 0.4-0.8 parts by mass of accelerant; where the curing agent is compounded by bisphenol F-based benzoxazine curing agent and dicyandiamide curing agent according to the mass ratio of 10: (8-9); DH-4000B aliphatic polyurethane acrylate is preferred for the aliphatic polyurethane acrylate.

As a further preferred solution, the raw materials of the high flexibility packaging film include: 22-24 parts by mass of silicon dioxide, 26 parts by mass of aliphatic polyurethane acrylate, 15 parts by mass of phenoxy resin, 5-8 parts by mass of flexible liquid epoxy resin, 10 parts by mass of bisphenol F epoxy resin, 19 parts by mass of curing agent, 2-5 parts by mass of photoinitiator, and 0.4-0.8 parts by mass of accelerant; where the curing agent is compounded by bisphenol F-based benzoxazine curing agent and dicyandiamide curing agent according to the mass ratio of 10:9; DH-4000B aliphatic polyurethane acrylate is preferred for the aliphatic polyurethane acrylate; YX-7105 resin is preferred for the flexible liquid epoxy resin.

As a further preferred solution, the raw materials of the high flexibility packaging film include: 24 parts by mass of silicon dioxide, 26 parts by mass of aliphatic polyurethane acrylate, 15 parts by mass of phenoxy resin, 5-8 parts by mass of flexible liquid epoxy resin, 10 parts by mass of bisphenol F epoxy resin, 19 parts by mass of curing agent, 2-5 parts by mass of photoinitiator, and 0.4-0.8 parts by mass of accelerant; where the curing agent is compounded by bisphenol F-based benzoxazine curing agent and dicyandiamide curing agent according to the mass ratio of 10:9; DH-4000B aliphatic polyurethane acrylate is preferred for the aliphatic polyurethane acrylate; YX-7105 resin is preferred for the flexible liquid epoxy resin.

In this application, silicon dioxide is used as an inorganic filler, mainly used to reduce the internal stress and thermal expansion coefficient of the material system; spherical silicon dioxide micropowder is preferred for the silicon dioxide.

In this application, aliphatic polyurethane acrylate, phenoxy resin, flexible liquid epoxy resin, and bisphenol F epoxy resin are resin matrix, in which aliphatic polyurethane acrylate and flexible liquid epoxy resin are used to enhance flexibility, and flexible liquid epoxy resin can also reduce energy storage modulus; phenoxy resin is used to enhance adhesion. Aliphatic polyurethane acrylate can be selected from DH-3000B, DH-4000B and other aliphatic polyurethane acrylates on the market, preferably DH-4000B aliphatic polyurethane acrylate. JER1256 phenoxy resin can be selected as the phenoxy resin. Flexible liquid epoxy resin can be selected from the EXA-4850 series products (e.g., EXA-4850-150, EXA-4850-1000) and/or YX-7105 product on the market, preferably YX-7105 product, or both EXA-4850 series products and YX-7105 product. When selecting EXA-4850 series products, the preferred parameters are: epoxy equivalent: 350-450 g/eq, molecular weight: 700-900, viscosity: 25° C., 15,000-100,000 mPa·s.

The curing agent is used to cross-link with the epoxy resin at a certain temperature and under the action of the accelerant, so that the material system changes from a flowing state to a solid state. In this application, the curing agents of bisphenol F-based benzoxazine and dicyandiamide are selected simultaneously. The accelerant is used as a catalyst for the cross-linking reaction, which is mainly used to regulate the curing time and has no effect on the performance of the material system. The conventional accelerant can be chosen and added according to the conventional dosage. In some specific embodiments, imidazole accelerants such as 4,5-dihydroxymethyl-2-phenyl-1H-imidazole can be selected as the accelerant. Since aliphatic polyurethane acrylate is a photosensitive resin, a photoinitiator should also be added. The photoinitiator can be selected as a conventional photoinitiator matching the aliphatic polyurethane acrylate. The photoinitiator is used to trigger the photocuring of the aliphatic polyurethane acrylate under ultraviolet (UV) light. In the example of this application, the dosage of the accelerant is 0.7-0.8 parts by mass, and the dosage of the photoinitiator is 3 parts by mass.

The preparation method of the high flexibility packaging film provided in the example of the application includes: taking and mixing each raw material according to parts by mass, grinding the mixed raw material into a gelatinous mass with a bead mill, obtaining the glue solution through vacuum defoaming, and coating the glue solution with a coating machine to obtain the packaging film of the application.

Several examples and comparison examples are provided below. The raw materials used in the examples and comparison examples are as follows:

Silicon dioxide: spherical silicon dioxide, D50 has a particle size of 0.6 microns;

Aliphatic polyurethane acrylate: DH-3000B aliphatic polyurethane acrylate, average molecular weight 13,000-18,000, 60° C. viscosity 35,000-50,000 mPa·s (millipascal·second); DH-4000B aliphatic polyurethane acrylate, average molecular weight 13,000-18,000, 60° C. viscosity 120,000-150,000 mPa·s;

Phenoxy resin: JER1256, molecular weight 51,000;

Flexible liquid epoxy resin: EXA-4850-150, epoxy equivalent: 450 g/eq, molecular weight: 900, viscosity: 25° C., 15,000 mPa·s; YX-7105 (also known as super-tough liquid epoxy resin): epoxy equivalent: 487 g/eq, viscosity: 50° C., 6,200 mPa·s;

Bisphenol F epoxy resin: YD-8170, epoxy equivalent: 159 g/eq;

Curing agent: bisphenol F-based benzoxazine CB4100; dicyandiamide;

Photoinitiator: photoinitiator 184 is selected, main component: 1-hydroxycyclohexyl phenyl ketone;

Accelerant: 4,5-dihydroxymethyl-2-phenyl-1H-imidazole.

The formulations and performance parameters of the comparison examples and examples are shown in Tables 1-2 respectively. The testing methods for the various performance parameters of the comparison examples and examples are as follows:

I. Film Tensile Strength and Elongation at Break:

The film material with a size of 10 mm*50 mm was cut, that is, the sample strip; the light release film was torn off; both ends of the sample strip were glued with adhesive tape. The fixtures of the universal material testing machine were used to hold the adhesive tape at both ends, respectively, and the heavy release film was torn off to test the tensile strength and elongation at break of the film.

II. Moisture Absorption Rate:

The film material with a size of 50 mm*50 mm was cut and pasted on the silicon wafer, exposed to a UV lamp for 20 s, cured at 180° C. for 1 h, and then weighed. Then the silicon wafer was completely immersed vertically in a glass container containing 25±1° C. distilled water without bubbles on the surface or contacting the wall of the container. After 24 h of immersion, it was removed with a tweezer, the water on the surface of the film was absorbed with filter paper, followed by immediate weighing. The moisture absorption rate was calculated according to the weight before and after.

III. Adhesion of Silicon Wafer:

Two pieces of 3 mm*3 mm film material with a thickness of 25 μm were pasted on the silicon wafer, first exposed to a UV lamp for 20 s, cured at 180° C. for 1 h, and then the shear bond strength was tested with a universal tensile testing machine.

IV. Tensile Strength and Elongation at Break after Curing:

The packaging film was first exposed to UV lamp for 20 s, and then cured at 180° C. for 1 h; the size of the sample made was 55 mm*10 mm*0.5 mm, and the sample was made into a dumbbell type. The fixtures of the universal material testing machine were respectively clamped at both ends, and the tensile strength and elongation at break were tested in the block stretch mode.

TABLE 1

Raw material formulations in comparison examples

| | comparison example 1 | comparison example 2 | comparison example 3 | comparison example 4 | comparison example 5 | comparison example 6 | comparison example 7 |
|---|---|---|---|---|---|---|---|
| Silicon dioxide | 10 | 10 | 15 | 15 | 20 | 20 | 20 |
| DH-3000B | 15 | 18 | 18 | 20 | 20 | 20 | 22 |
| 1256 | / | / | 8 | 8 | 10 | 10 | 10 |
| EXA-4850 | 10 | 10 | 10 | 9 | 9 | 8 | 8 |
| 8170 | 10 | 10 | 10 | 10 | 10 | 10 | 10 |
| CB4100 | 10 | 8 | 10 | 10 | 10 | 10 | 10 |
| DICY | 5 | 6 | 6 | 6.5 | 6.5 | 6.5 | 6.5 |
| 184 | 2 | 2 | 2 | 2 | 2 | 2 | 3 |
| 4,5-Dihydroxy-methyl-2-phenyl-1H-imidazole | 0.5 | 0.6 | 0.6 | 0.6 | 0.65 | 0.65 | 0.7 |

TABLE 2

Test values of performance parameters corresponding to comparison examples

| | comparison example 1 | comparison example 2 | comparison example 3 | comparison example 4 | comparison example 5 | comparison example 6 | comparison example 7 |
|---|---|---|---|---|---|---|---|
| Film tensile strength | 1.8 MPa | 1.8 MPa | 2.1 MPa | 2.1 MPa | 2.4 MPa | 2.3 MPa | 2.4 MPa |
| Film elongation at break | 180% | 185% | 200% | 220% | 215% | 215% | 230% |
| Tensile strength after curing | 18.5 MPa | 19.0 MPa | 23.0 MPa | 23.2 MPa | 25.0 MPa | 25.5 MPa | 25 MPa |
| Elongation at break after curing | 18% | 20% | 20% | 24% | 24.5% | 23% | 26% |
| Glass transition temperature Tg | 105° C. | 107° C. | 112° C. | 113° C. | 119° C. | 120° C. | 123° C. |
| Moisture absorption rate | 0.65% | 0.60% | 0.61% | 0.56% | 0.51% | 0.45% | 0.44% |
| Adhesion of silicon wafer | 7.2 MPa | 7.2 MPa | 7.6 MPa | 7.5 MPa | 8.0 MPa | 8.0 MPa | 8.7 MPa |

TABLE 3

Raw material formulations and test values of performance parameters in examples

| | example 1 | example 2 | example 3 | example 4 | example 5 | example 6 | example 7 | example 8 | example 9 |
|---|---|---|---|---|---|---|---|---|---|
| Silicon dioxide | 20 | 20 | 20 | 20 | 22 | 22 | 22 | 24 | 24 |
| DH-3000B | 24 | 26 | 26 | / | / | / | / | / | / |
| DH-4000B | / | / | / | 24 | 26 | 26 | 26 | 26 | 26 |

TABLE 3-continued

Raw material formulations and test values of performance parameters in examples

| | example 1 | example 2 | example 3 | example 4 | example 5 | example 6 | example 7 | example 8 | example 9 |
|---|---|---|---|---|---|---|---|---|---|
| 1256 | 12 | 12 | 15 | 12 | 12 | 15 | 15 | 15 | 15 |
| EXA-4850 | 8 | 8 | 6 | 6 | 6 | 6 | / | / | / |
| YX-7105 | / | 5 | 5 | / | / | / | 5 | 5 | 8 |
| 8170 | 10 | 10 | 10 | 10 | 10 | 10 | 10 | 10 | 10 |
| CB4100 | 10 | 10 | 10 | 10 | 10 | 10 | 10 | 10 | 10 |
| DICY | 7 | 7 | 7 | 7 | 8 | 8 | 9 | 9 | 9 |
| 184 | 3 | 3 | 3 | 3 | 3 | 3 | 3 | 3 | 3 |
| 4,5-Dihydroxy-methyl-2-phenyl-1H-imidazole | 0.7 | 0.7 | 0.7 | 0.7 | 0.7 | 0.7 | 0.7 | 0.7 | 0.8 |

TABLE 4

Test values of performance parameters in examples

| | example 1 | example 2 | example 3 | example 4 | example 5 | example 6 | example 7 | example 8 | example 9 |
|---|---|---|---|---|---|---|---|---|---|
| Film tensile strength (MPa) | 2.8 | 2.8 | 3.0 | 3.2 | 3.6 | 3.8 | 4.2 | 4.6 | 4.5 |
| Film elongation at break (%) | 260 | 290 | 300 | 330 | 350 | 360 | 385 | 385 | 400 |
| Tensile strength after curing (MPa) | 28.2 | 28.0 | 29.5 | 30.0 | 31.2 | 32.0 | 31.0 | 32.5 | 33.0 |
| Elongation at break after curing (%) | 28 | 32 | 34 | 34 | 38 | 38 | 42 | 45 | 48 |
| Glass transition temperature (Tg/° C.) | 121 | 122 | 122 | 135 | 136 | 136 | 137 | 140 | 142 |
| Moisture absorption rate (%) | 0.42 | 0.41 | 0.35 | 0.32 | 0.30 | 0.30 | 0.23 | 0.21 | 0.21 |
| Adhesion of silicon wafer (MPa) | 11.5 | 12.3 | 13.0 | 14.6 | 15.8 | 18.2 | 16.8 | 17.0 | 16.5 |

The above examples are intended only to clearly illustrate the examples made and are not intended to limit the implementations. For ordinary technical personnel in the field, other alterations or changes in different forms can be made on the basis of the above description, and it is not necessary and impossible to give an exhaustive list of all implementations, so the obvious changes or alterations that are extended are still within the scope of protection of the invention.

What is claimed is:

1. A packaging film, wherein raw materials of the packaging film comprise:
20-24 parts by mass of silicon dioxide, 24-26 parts by mass of aliphatic polyurethane acrylate, 12-15 parts by mass of phenoxy resin, 5-13 parts by mass of flexible liquid epoxy resin, 10 parts by mass of bisphenol F epoxy resin, 17-19 parts by mass of a curing agent, 2-5 parts by mass of a photoinitiator, and 0.4-0.8 parts by mass of an accelerant; wherein the curing agent is compounded by a bisphenol F-based benzoxazine curing agent and a dicyandiamide curing agent according to a mass ratio of 10: (7-9).

2. The packaging film according to claim 1, wherein the raw materials of the packaging film comprise:
22-24 parts by mass of the silicon dioxide, 26 parts by mass of the aliphatic polyurethane acrylate, 12-15 parts by mass of the phenoxy resin, 5-8 parts by mass of the flexible liquid epoxy resin, 10 parts by mass of the bisphenol F epoxy resin, 18-19 parts by mass of the curing agent, 2-5 parts by mass of the photoinitiator, and 0.4-0.8 parts by mass of the accelerant; wherein the curing agent is compounded by the bisphenol F-based benzoxazine curing agent and the dicyandiamide curing agent according to a mass ratio of 10: (8-9).

3. The packaging film according to claim 1, wherein the raw materials of the packaging film comprise:
22-24 parts by mass of the silicon dioxide, 26 parts by mass of the aliphatic polyurethane acrylate, 15 parts by mass of the phenoxy resin, 5-8 parts by mass of the flexible liquid epoxy resin, 10 parts by mass of the bisphenol F epoxy resin, 19 parts by mass of the curing agent, 2-5 parts by mass of the photoinitiator, and 0.4-0.8 parts by mass of the accelerant; wherein the curing agent is compounded by the bisphenol F-based benzoxazine curing agent and the dicyandiamide curing agent according to a mass ratio of 10:9.

4. The packaging film according to claim 1, wherein the raw materials of the packaging film comprise:

24 parts by mass of the silicon dioxide, 26 parts by mass of the aliphatic polyurethane acrylate, 15 parts by mass of the phenoxy resin, 5-8 parts by mass of the flexible liquid epoxy resin, 10 parts by mass of the bisphenol F epoxy resin, 19 parts by mass of the curing agent, 2-5 parts by mass of the photoinitiator, and 0.4-0.8 parts by mass of the accelerant; wherein the curing agent is compounded by the bisphenol F-based benzoxazine curing agent and the dicyandiamide curing agent according to a mass ratio of 10:9.

5. The packaging film according to claim 1, wherein the silicon dioxide is a spherical silicon dioxide micropowder.

6. A preparation method of the packaging film according to claim 1, comprising:

taking and mixing the raw materials according to parts by mass, grinding mixed raw materials into a gelatinous mass, obtaining a glue solution through a vacuum defoaming, and coating the glue solution to obtain the packaging film.

7. A filter packaging method, comprising using the packaging film according to claim 1 in packaging of a filter chip.

8. The filter packaging method according to claim 7, wherein the packaging film covers a front and surrounding sides of the filter chip.

9. The packaging film according to claim 2, wherein the silicon dioxide is a spherical silicon dioxide micropowder.

10. The packaging film according to claim 3, wherein the silicon dioxide is a spherical silicon dioxide micropowder.

11. The packaging film according to claim 4, wherein the silicon dioxide is a spherical silicon dioxide micropowder.

12. The preparation method according to claim 6, wherein in the raw materials of the packaging film, the silicon dioxide is a spherical silicon dioxide micropowder.

* * * * *